United States Patent
Kikuchi

(10) Patent No.: US 10,748,805 B2
(45) Date of Patent: Aug. 18, 2020

(54) VACUUM ATTRACTION MEMBER

(71) Applicant: NGK SPARK PLUG CO., LTD., Nagoya, Aichi (JP)

(72) Inventor: Shinya Kikuchi, Sendai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 241 days.

(21) Appl. No.: 15/960,853

(22) Filed: Apr. 24, 2018

(65) Prior Publication Data

US 2018/0315638 A1    Nov. 1, 2018

(30) Foreign Application Priority Data

May 1, 2017   (JP) .................. 2017-091323

(51) Int. Cl.
  *H01L 21/683* (2006.01)
  *B25B 11/00* (2006.01)
  *H01L 21/687* (2006.01)

(52) U.S. Cl.
  CPC ........ *H01L 21/6838* (2013.01); *B25B 11/005* (2013.01); *H01L 21/6875* (2013.01)

(58) Field of Classification Search
  CPC .............. B25B 11/005; H01L 21/6838; H01L 21/6875
  USPC ................... 269/21, 903, 900, 254
  See application file for complete search history.

(56) References Cited

U.S. PATENT DOCUMENTS

| | | | | |
|---|---|---|---|---|
| 5,937,993 | A | * | 8/1999 | Sheets .................. B25B 11/005 198/345.1 |
| 2007/0128889 | A1 | * | 6/2007 | Goto ................. H01L 21/67103 438/795 |
| 2010/0133735 | A1 | * | 6/2010 | Katsuta .................. B23Q 3/088 269/21 |

FOREIGN PATENT DOCUMENTS

| JP | 2013191601 A | 9/2013 |
|---|---|---|
| JP | 2016119337 A | 6/2016 |

OTHER PUBLICATIONS

"Metal bellows replace springs", 2012, StackPack, <https://www.machinedesign.com/news/article/21829661/metal-bellows-replaces-springs> Access Date: Feb. 14, 2020 (Year: 2012).*

* cited by examiner

*Primary Examiner* — Orlando E Aviles
*Assistant Examiner* — Khawaja H Samiullah
(74) *Attorney, Agent, or Firm* — Stites & Harbison, PLLC; Jeffrey A. Haeberlin; James R. Hayne

(57) ABSTRACT

A substrate is arranged above a base body such that the substrate comes into contact with an upper end of a support member. Subsequently, vacuum suction is performed on an internal space of the support member through an auxiliary vacuum suction path so that the upper end of the support member is displaced to a height position equal to the height positions of upper ends of multiple protruding portions. Then, vacuum suction is performed, through a vacuum suction path, on a space of which the top and the bottom are defined by the base body and the substrate so that the substrate is brought into contact with the upper ends of the multiple protruding portions.

10 Claims, 4 Drawing Sheets

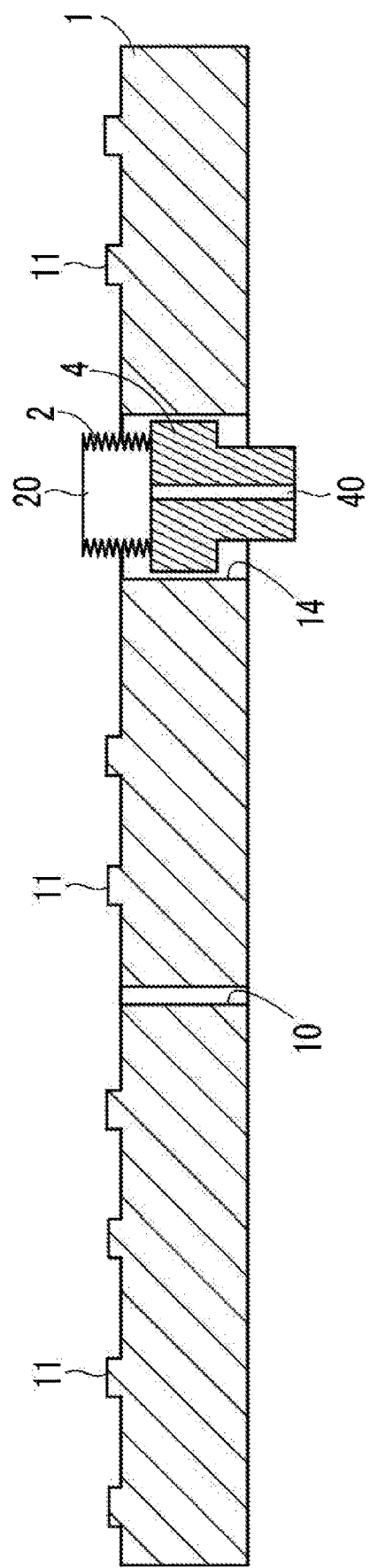

VACUUM ATTRACTION MEMBER

CROSS REFERENCE TO RELATED APPLICATION

The present application claims priority to Japanese Patent Application No. 2017-091323, which was filed on May 1, 2017, the disclosure of which is herein incorporated by reference in its entirety.

BACKGROUND OF THE INVENTION

Field of the Invention

The present invention relates to a vacuum attraction member used for holding a substrate such as a semiconductor wafer by vacuum attraction.

Description of Related Art

Vacuum attraction devices are proposed that each hold a warped or deformed substrate by attraction with the shape thereof being corrected to be flat. A technique is proposed with which, even if a substrate is different in unevenness state, the substrate is held by attraction with the shape thereof being corrected to be flat, through separate control of suction actions that are performed by circumferential rim lift pins and an inner circumference lift pin in accordance with the warped shape of the substrate (e.g., see Patent Document 1). A technique is proposed with which a warped substrate is corrected by a substrate holding stage configured such that attraction nozzles that are partially in air-tight contact with the inner-side surfaces of respective through holes in a placement plate are moved to the placement plate side, through suction actions to suck the substrate that are performed by the attraction nozzles (e.g., see Patent Document 2).

RELATED ART DOCUMENT

Patent Document 1 is Japanese Patent Application Laid-Open (kokai) No. 2013-191601.
Patent Document 2 is Japanese Patent Application Laid-Open (kokai) No. 2016-119337.

BRIEF SUMMARY OF THE INVENTION

In recent years, however, since required criteria for substrate flatness have been becoming higher, there is a possibility that substrate flatness is insufficient with a conventional technique in which, in order to attract a warped substrate, the substrate is first attracted by a member connected to a vacuum suction device and protruding from a placement surface of a base body, and thereafter, the substrate is attracted to the placement surface.

Accordingly, an object of the present invention is to provide a vacuum attraction member and a vacuum attraction method that enable improvement of the flatness of a substrate held by vacuum attraction.

A vacuum attraction member according to the present invention includes: a base body; multiple protruding portions protruding from an upper surface of the base body; a vacuum suction path passing through an inside of the base body and having an opening in the upper surface of the base body; a support member that is provided so as to be surrounded by the multiple protruding portions when viewed from the upper surface side of the base body, and that has an upper end capable of being displaced from a position higher than positions of upper ends of the multiple protruding portions to a height position equal to height positions of the upper ends of the multiple protruding portions, the support member having an internal space that communicates with an outside through an opening in the upper end of the support member; and an auxiliary vacuum suction path that passes through an inside of the base body or an inside of a base member separate from the base body, and that communicates with the internal space of the support member.

With the vacuum attraction member according to the present invention, at first, the substrate is arranged above the base body such that the substrate comes into contact with the upper end of the support member. Subsequently, vacuum suction is performed on the internal space of the support member through the auxiliary vacuum suction path so that the upper end of the support member is displaced to the height position equal to the height positions of the upper ends of the multiple protruding portions. As a result, equalization of the height positions of the lower surface and the upper surface of the substrate is performed in a first phase such that the lower surface of the substrate comes, as a whole, into contact with the upper ends of the multiple protruding portions.

Then, vacuum suction is performed, through the vacuum suction path, on a space of which the top and the bottom are defined by the base body and the substrate so that the substrate is brought into contact with the upper ends of the multiple protruding portions. As a result, equalization of the height positions of the lower surface and the upper surface of the substrate is performed in a second phase that is a further advanced phase relative to the first phase such that the lower surface of the substrate more assuredly comes, as a whole, into contact with the upper ends of the multiple protruding portions. Since equalization of the height positions of the upper surface and the lower surface of the substrate is performed over the two phases, the flatness of the substrate is assuredly improved.

The vacuum attraction member according to the present invention preferably further includes an auxiliary protruding portion that is provided on the upper surface of the base body or an upper surface of the base member, and that has an upper end of which a height position becomes equal to the height positions of the upper ends of the multiple protruding portions at least when the upper end of the support member is displaced to the height position equal to the height positions of the upper ends of the multiple protruding portions, the auxiliary protruding portion being accommodated in the internal space of the support member.

With the vacuum attraction member having the above-described configuration, a situation is avoided where the height position of the lower surface locally varies in a region corresponding to the internal space of the support member in the substrate, as compared with a region which is on the outer side of the support member and in which the multiple protruding portions are provided. Accordingly, the flatness of each of the lower surface and the upper surface of the substrate is further improved.

In the vacuum attraction member according to the present invention, it is preferable that the auxiliary vacuum suction path is a suction path passing through the inside of the base body and communicating with the internal space of the support member, the support member is configured by (i.e., includes) a tubular bellows member having an open top and an open bottom, and the base body has (i.e., defines) an annular recessed portion accommodating at least a lower portion of the bellows member.

With the vacuum attraction member having the above-described configuration, since the bellows member by which the support member is configured can expand and contract, a substrate that is warped, bent, or otherwise deformed can be brought into contact with the upper end of the support member such that the upper end of the support member fits the shape of the substrate. As a result, smooth and accurate equalization of the height positions of the lower surface and the upper surface of the substrate is performed in the first phase.

A vacuum attraction method according to the present invention is a method for supporting a substrate by attraction with use of the vacuum attraction member according to the present invention, the method including: arranging the substrate above the base body of the vacuum attraction member, to bring the substrate into contact with the upper end of the support member; performing vacuum suction on the internal space of the support member through the auxiliary vacuum suction path, to displace the upper end of the support member to the height position equal to the height positions of the upper ends of the multiple protruding portions; and performing, through the vacuum suction path, vacuum suction on a space of which a top and a bottom are defined by the base body and the substrate, to bring the substrate into contact with the upper ends of the multiple protruding portions.

With the vacuum attraction method according to the present invention, since equalization of the height positions of the upper surface and the lower surface of the substrate is performed over the two phases, the flatness of the substrate is assuredly improved.

The vacuum attraction method according to the present invention preferably further includes adjusting both of: a negative pressure generated, through the vacuum suction path, in the space of which the top and the bottom are defined by the base body and the substrate; and a negative pressure generated in the internal space of the support member through the auxiliary vacuum suction path.

With the vacuum attraction method having the above-described feature, equalization is assuredly performed of the height positions of the lower surface and the upper surface of the substrate in a region which is on the outer side of the support member and in which the multiple protruding portions are provided and in a region corresponding to the internal space of the support member, in the substrate, whereby the flatness of each of the lower surface and the upper surface of the substrate is further improved.

BRIEF DESCRIPTION OF THE DRAWINGS

Illustrative aspects of the invention will be described in detail with reference to the following figures wherein:

FIG. 1 is an explanatory view of the configuration of a vacuum attraction member according to a first embodiment of the present invention.

DETAILED DESCRIPTION OF EXEMPLARY EMBODIMENTS OF THE INVENTION

A. First Embodiment

Figure 2A:
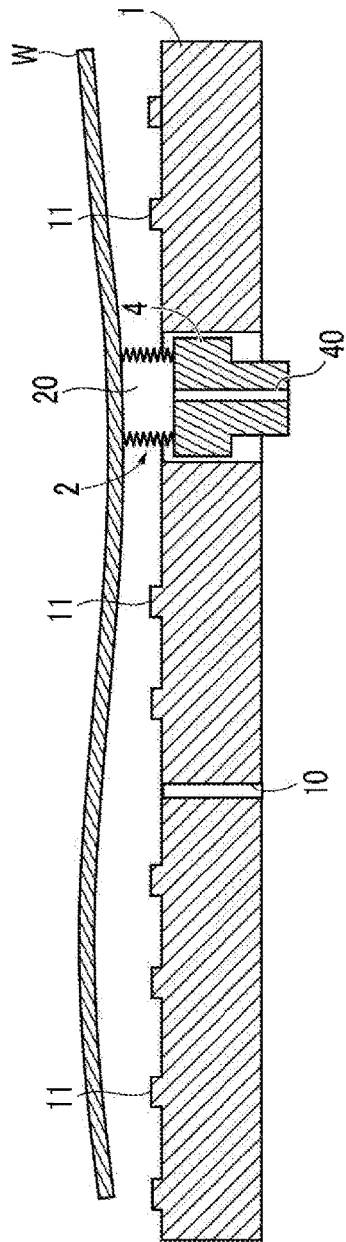
FIGS. 2A, 2B, and 2C are explanatory views of a vacuum attraction method according to the first embodiment of the present invention.

A vacuum attraction member according to a first embodiment of the present invention shown in FIG. 1 includes a base body 1 and a support member 2. The base body 1 is formed of, for example, a substantially flat-plate-shaped ceramic sintered body. The base body 1 includes: multiple protruding portions 11 formed so as to protrude from an upper surface thereof; a vacuum suction path 10 formed so as to pass through the inside of the base body 1 and have an opening in the upper surface of the base body 1; and a through hole 14 formed so as to penetrate the base body 1 in the thickness direction thereof.

The multiple protruding portions 11 are arranged in a regular pattern such as a triangular lattice pattern or a square lattice pattern. Each of the multiple protruding portions 11 has a columnar shape, a frustum shape, or a shape obtained by stacking multiple columns or frustums in the axis direction, and is formed by blasting, laser processing, or a combination thereof. An annular protruding portion (not shown) may be formed on the upper surface of the base body 1 so as to surround the multiple protruding portions 11 and so as to protrude from the upper surface such that the height position of an upper end of the annular protruding portion is equal to the height positions of upper ends of the protruding portions 11 or such that the height position of the upper end of the annular protruding portion is lower than the height positions of the upper ends of the protruding portions 11.

Although not expressly shown, the through hole 14 is formed so as to be surrounded by the multiple protruding portions 11 when viewed from the upper surface side of the base body 1. The through hole 14 may be formed at each of multiple portions that are located on the same circumference so as to be spaced apart from each other at equal intervals in the circumferential direction, and may be formed at the center of the base body 1. The through hole 14 may be formed so as to curvedly or linearly extend when the base body 1 is viewed from above. In a case where the annular protruding portion is formed on the base body 1, the through hole 14 is arranged on the inner side of the annular protruding portion.

In the present embodiment, the support member 2 is configured by a tubular bellows member having a lower portion thereof accommodated in the through hole 14. The support member 2 has an upper end capable of being displaced from a position higher than the positions of the upper ends of the multiple protruding portions 11 to a height position equal to the height positions of the upper ends of the multiple protruding portions 11. The support member 2 has an internal space 20 that communicates with the outside through an opening in the upper end of the support member 2. The support member 2 is fixed to an upper portion of a base member 4 that is separate from the base body 1. In the base member 4, an auxiliary vacuum suction path 40 is formed so as to pass through the inside thereof and communicate with the internal space 20 of the support member 2. The base member 4 may be fixed to the base body 1, or may be arranged such that the base member 4 can be displaced relative to the base body 1 by a raising/lowering mechanism.

The vacuum suction path 10 and the auxiliary vacuum suction path 40 are each connected to a vacuum suction device (not shown).

With the vacuum attraction member having the above-described configuration, at first, a substrate W such as a semiconductor wafer is arranged above the base body 1 such that the substrate W comes into contact with the upper end of the support member 2 (see FIG. 2A). Since the bellows member by which the support member 2 is configured can expand and contract, a substrate W that is warped, bent, or otherwise deformed can be brought into contact with the upper end of the support member 2 such that the upper end of the support member 2 fits the shape of the substrate W.

Figure 2B:
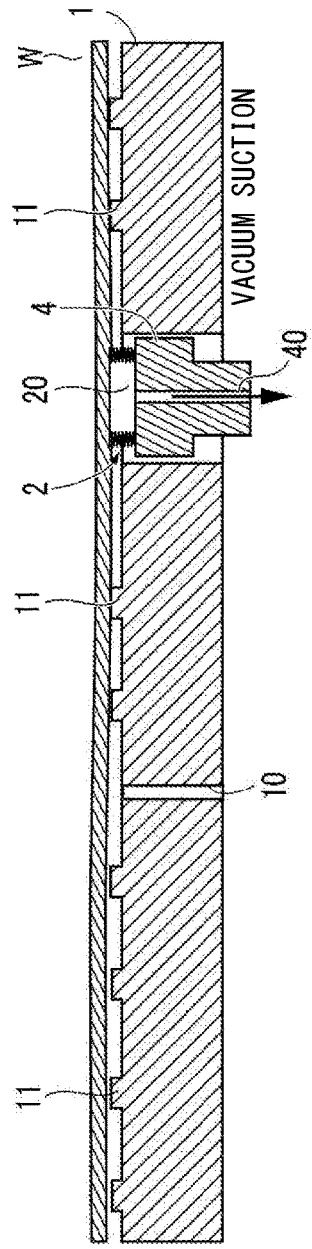

Subsequently, vacuum suction is performed on the internal space 20 of the support member 2 through the auxiliary vacuum suction path 40 so that the upper end of the support member 2 is displaced to the height position equal to the height positions of the upper ends of the multiple protruding portions 11 (see FIG. 2B). As a result, equalization of the height positions of the lower surface and the upper surface of the substrate W is performed in a first phase such that the lower surface of the substrate W comes, as a whole, into contact with the upper ends of the multiple protruding portions 11. The base member 4 may be driven so as to be displaced upward or downward by the raising/lowering mechanism.

Figure 2C:
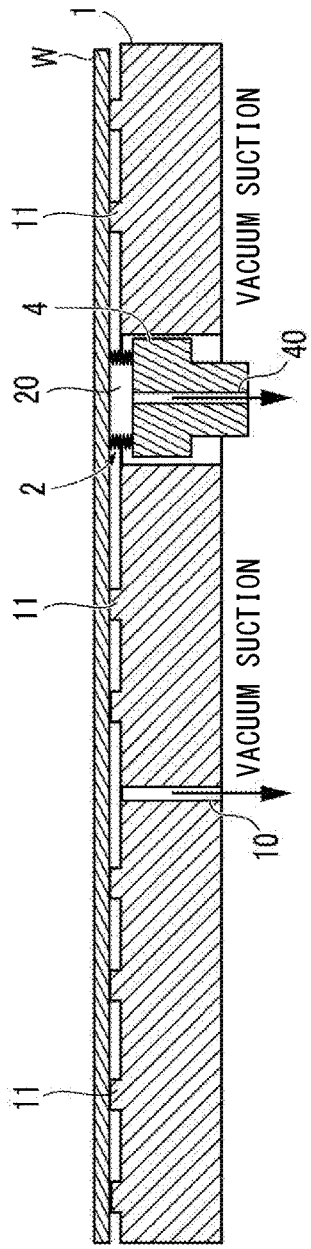

Then, vacuum suction is performed, through the vacuum suction path 10, on a space of which the top and the bottom are defined by the base body 1 and the substrate W so that the substrate W is brought into contact with the upper ends of the multiple protruding portions 11 (see FIG. 2C). As a result, equalization of the height positions of the lower surface and the upper surface of the substrate W is performed in a second phase that is a further advanced phase relative to the first phase such that the lower surface of the substrate W more assuredly comes, as a whole, into contact with the upper ends of the multiple protruding portions 11. Since equalization of the height positions of the upper surface and the lower surface of the substrate W is performed over the two phases, the flatness of the substrate W is assuredly improved.

In addition, adjustment may be performed of both of: a negative pressure (second negative pressure) generated, through the vacuum suction path 10, in the space of which the top and the bottom are defined by the base body 1 and the substrate W; and a negative pressure (first negative pressure) generated in the internal space 20 of the support member 2 through the auxiliary vacuum suction path 40. For example, the first negative pressure generated in the first-phase equalization of the height position of the lower surface of the substrate W may be controlled to be lower or higher than the second negative pressure generated in the second-phase equalization of the height position of the lower surface of the substrate W. The second negative pressure may be controlled to be higher or lower than the first negative pressure.

Accordingly, equalization is assuredly performed of the height positions of the lower surface and the upper surface of the substrate W in a region which is on the outer side of the support member 2 and in which the multiple protruding portions 11 are provided and in a region corresponding to the internal space 20 of the support member 2, in the substrate W, whereby the flatness of each of the lower surface and the upper surface of the substrate W is further improved.

B. Second Embodiment

Figure 3:
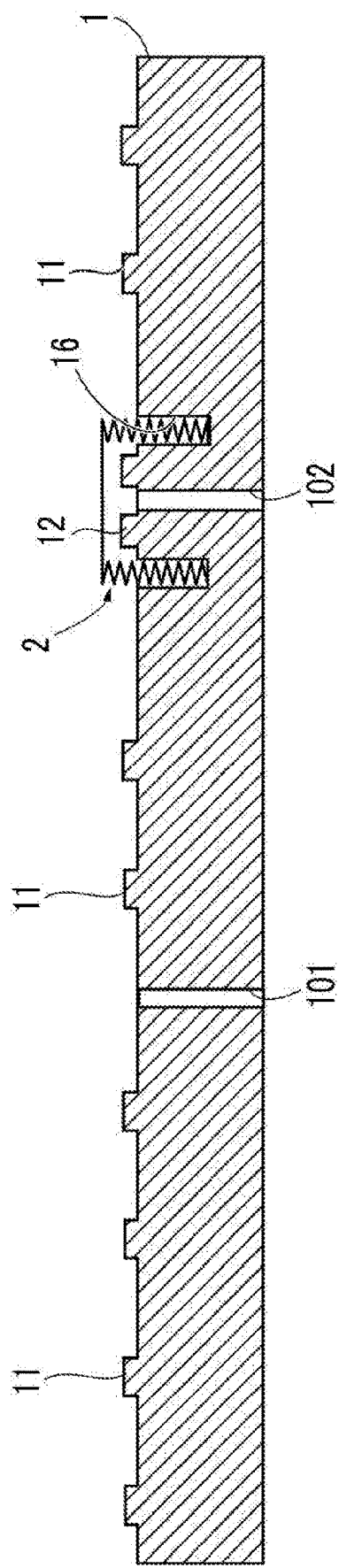
FIG. 3 is an explanatory view of the configuration of a vacuum attraction member according to a second embodiment of the present invention.

In the vacuum attraction member according to a second embodiment of the present invention shown in FIG. 3, an annular recessed portion 16, instead of the through hole 14 (see FIG. 1), is formed in the base body 1 so as to be annularly recessed from the upper surface of the base body 1. In a region, of the upper surface of the base body 1, that is surrounded by the annular recessed portion 16, one or more auxiliary protruding portions 12 are each formed so as to have an upper end of which the height position becomes equal to the height positions of the upper ends of the multiple protruding portions 11. Similarly to the protruding portions 11, each auxiliary protruding portion 12 has a columnar shape, a frustum shape, or a shape obtained by stacking multiple columns or frustums in the axis direction, and is formed by blasting, laser processing, or a combination thereof.

A lower portion of the support member 2 configured by a bellows member is accommodated in the annular recessed portion 16, and is supported by, instead of the base member 4 (see FIG. 1), the bottom of the annular recessed portion 16. In the base body 1, an auxiliary vacuum suction path 102 is formed so as to pass through the inside thereof and have an opening in a region, of the upper surface of the base body 1, that is surrounded by the annular recessed portion 16.

The other components are similar to those in the first embodiment, and thus, the same or corresponding components are designated by the same reference numerals, and the description thereof is omitted.

Figure 4A:
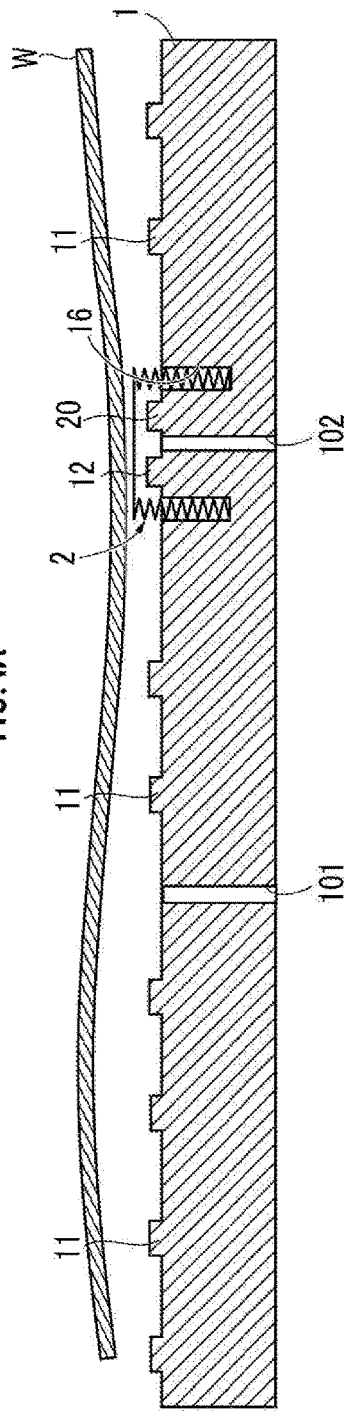
FIGS. 4A, 4B, and 4C are explanatory views of a vacuum attraction method according to the second embodiment of the present invention.

In the vacuum attraction member having the above-described configuration, at first, a substrate W is arranged above the base body 1 such that the substrate W comes into contact with the upper end of the support member 2 (see FIG. 4A). Since the bellows member by which the support member 2 is configured can expand and contract, a substrate W that is warped, bent, or otherwise deformed can be brought into contact with the upper end of the support member 2 such that the upper end of the support member 2 fits the shape of the substrate W.

Figure 4B:
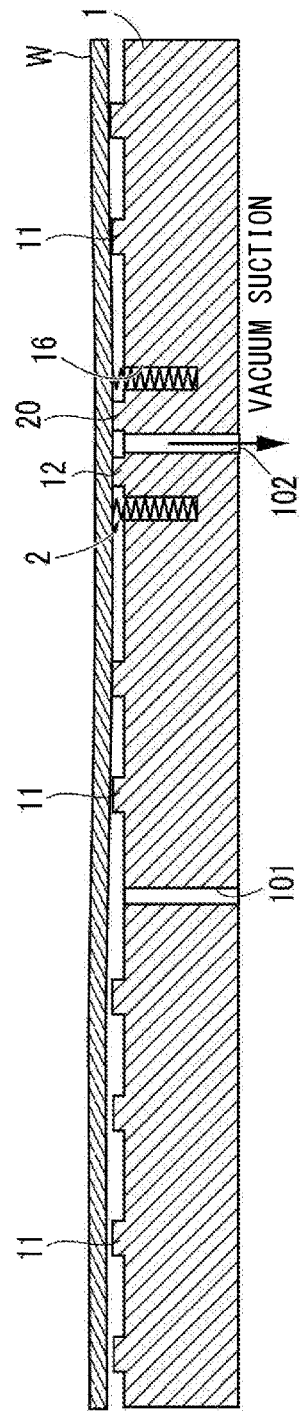

Subsequently, vacuum suction is performed on the internal space 20 of the support member 2 through the auxiliary vacuum suction path 102 so that the upper end of the support member 2 is displaced to a height position equal to the height positions of the upper ends of the multiple protruding portions 11 and the auxiliary protruding portion 12 (see FIG. 4B). As a result, equalization of the height positions of the lower surface and the upper surface of the substrate W is performed in a first phase such that the lower surface of the substrate W comes, as a whole, into contact with the upper ends of the multiple protruding portions 11 and the auxiliary protruding portion 12.

Figure 4C:
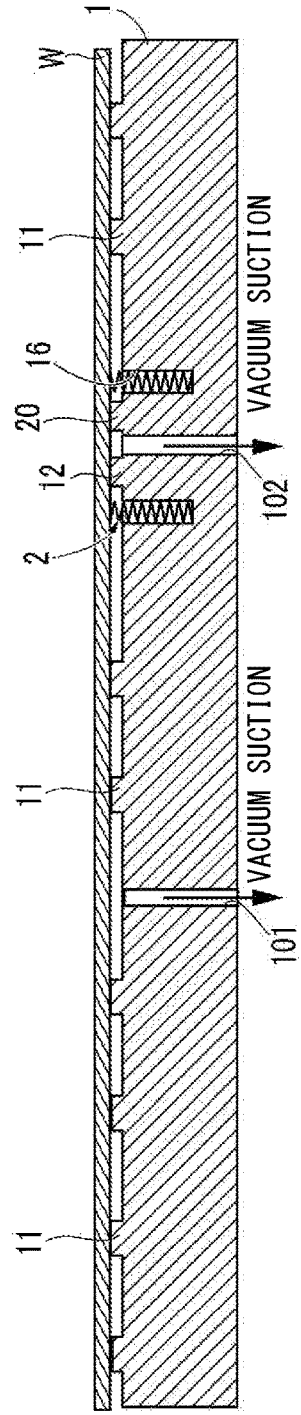

Then, vacuum suction is performed, through the vacuum suction path 101, on a space of which the top and the bottom are defined by the base body 1 and the substrate W so that the substrate W is brought into contact with the upper ends of the multiple protruding portions 11 (see FIG. 4C). As a result, equalization of the height positions of the lower surface and the upper surface of the substrate W is performed in a second phase that is a further advanced phase relative to the first phase such that the lower surface of the substrate W more assuredly comes, as a whole, into contact with the upper ends of the multiple protruding portions 11 and the auxiliary protruding portion 12. Since equalization of the height positions of the upper surface and the lower surface of the substrate W is performed over the two phases, the flatness of the substrate W is assuredly improved.

In addition, adjustment may be performed of both of: a negative pressure generated, through the vacuum suction path 101, in the space of which the top and the bottom are defined by the base body 1 and the substrate W; and a negative pressure generated in the internal space 20 of the support member 2 through the auxiliary vacuum suction path 102. Accordingly, equalization is assuredly performed of the height positions of the lower surface and the upper surface of the substrate W in a region which is on the outer side of the support member 2 and in which the multiple protruding portions 11 are provided and in a region corresponding to the internal space 20 of the support member 2, in the substrate W, whereby the flatness of each of the lower surface and the upper surface of the substrate W is further improved.

C. Other Embodiments of the Present Invention

In the first embodiment, the auxiliary protruding portion may be provided on the upper surface of the base member 4, similarly to the second embodiment. In the second embodiment, the auxiliary protruding portion 12 may be omitted.

The support member 2 may be configured by, for example, a tubular member, instead of the bellows member, that is formed of a material that has such a flexibility or an elasticity that the upper end thereof can be displaced from a position higher than the positions of the upper ends of the multiple protruding portions 11 to a height position equal to the height positions of the upper ends of the multiple protruding portions 11.

DESCRIPTION OF REFERENCE NUMERALS

1: base body
2: support member (bellows member)
4: base member
10, 101: vacuum suction path
11: protruding portion
12: auxiliary protruding portion
14: through hole
16: annular recessed portion
20: internal space
40, 102: auxiliary vacuum suction path

What is claimed is:

1. A vacuum attraction member comprising:
a base body having an inside and an upper surface, the base body defining a vacuum suction path passing through the inside and having an opening at the upper surface;
multiple protruding portions protruding from the upper surface of the base body, each of the multiple protruding portions having an upper end at a height position;
a support member surrounded by the multiple protruding portions when viewed from the upper surface side of the base body, and having an upper end capable of being displaced from a position higher than the height position of the upper end of each of the multiple protruding portions to a height position equal to the height position of the upper end of each of the multiple protruding portions, the support member defining an internal space that communicates with an outside through an opening in the upper end of the support member; and an auxiliary protruding portion provided directly on the upper surface of the base body and accommodated in the internal space of the support member;
wherein the base body defines an auxiliary vacuum suction path passing through the inside of the base body and that communicates with the internal space of the support member.

2. The vacuum attraction member according to claim 1, wherein
the auxiliary protruding portion has an upper end at a height position that becomes equal to the height position of the upper end of each of the multiple protruding portions at least when the upper end of the support member is displaced to the height position equal to the height position of the upper end of each of the multiple protruding portions.

3. The vacuum attraction member according to claim 2, wherein
the support member includes a tubular bellows member having an open top and an open bottom, and
the base body defines an annular recessed portion accommodating at least a lower portion of the bellows member.

4. The vacuum attraction member according to claim 1, wherein
the support member includes a tubular bellows member having an open top and an open bottom, and
the base body defines an annular recessed portion accommodating at least a lower portion of the bellows member.

5. A vacuum attraction method for supporting a substrate by attraction with use of the vacuum attraction member according to claim 1, the vacuum attraction method comprising:
arranging a substrate above the base body of the vacuum attraction member to bring the substrate into contact with the upper end of the support member;
performing vacuum suction on the internal space of the support member through the auxiliary vacuum suction path, to displace the upper end of the support member to the height position equal to the height position of the upper end of each of the multiple protruding portions; and
performing, through the vacuum suction path, vacuum suction on a space of which a top and a bottom are defined by the base body and the substrate, to bring the substrate into contact with the upper end of each of the multiple protruding portions.

6. The vacuum attraction method according to claim 5, further comprising
adjusting a negative pressure generated, through the vacuum suction path, in the space of which the top and the bottom are defined by the base body and the substrate; and
adjusting a negative pressure generated in the internal space of the support member through the auxiliary vacuum suction path.

7. A vacuum attraction member comprising:
a base body having an inside and an upper surface, the base body defining a vacuum suction path passing through the inside and having an opening at the upper surface;
multiple protruding portions protruding from the upper surface of the base body, each of the multiple protruding portions having an upper end at a height position; and
a support member surrounded by the multiple protruding portions when viewed from the upper surface side of the base body, and having an upper end capable of being displaced from a position higher than the height position of the upper end of each of the multiple protruding portions to a height position equal to the height position of the upper end of each of the multiple protruding portions, the support member defining an internal space that communicates with an outside through an opening in the upper end of the support member;

wherein the base body defines an auxiliary vacuum suction path passing through an inside of a base member separate from the base body, and the auxiliary vacuum suction path communicates with the internal space of the support member; wherein, an auxiliary protruding portion is provided directly on the upper surface of the base body and accommodated in the internal space of the support member.

8. The vacuum attraction member according to claim 7, wherein the auxiliary protruding portion has an upper end at a height position that becomes equal to the height position of the upper end of each of the multiple protruding portions at least when the upper end of the support member is displaced to the height position equal to the height position of the upper end of each of the multiple protruding portions.

9. A vacuum attraction method for supporting a substrate by attraction with use of the vacuum attraction member according to claim 7, the vacuum attraction method comprising:

arranging a substrate above the base body of the vacuum attraction member to bring the substrate into contact with the upper end of the support member;

performing vacuum suction on the internal space of the support member through the auxiliary vacuum suction path, to displace the upper end of the support member to the height position equal to the height position of the upper end of each of the multiple protruding portions; and performing, through the vacuum suction path, vacuum suction on a space of which a top and a bottom are defined by the base body and the substrate, to bring the substrate into contact with the upper end of each of the multiple protruding portions.

10. The vacuum attraction method according to claim 9, further comprising adjusting a negative pressure generated, through the vacuum suction path, in the space of which the top and the bottom are defined by the base body and the substrate; and adjusting a negative pressure generated in the internal space of the support member through the auxiliary vacuum suction path.

* * * * *